(12) United States Patent
Chi et al.

(10) Patent No.: US 10,698,846 B2
(45) Date of Patent: Jun. 30, 2020

(54) DDR SDRAM PHYSICAL LAYER INTERFACE CIRCUIT AND DDR SDRAM CONTROL DEVICE

(71) Applicant: REALTEK SEMICONDUCTOR CORPORATION, Hsinchu (TW)

(72) Inventors: Kuo-Wei Chi, Hsinchu (TW); Chun-Chi Yu, Hsinchu County (TW); Chih-Wei Chang, Hsinchu County (TW); Gerchih Chou, San Jose, CA (US); Shih-Chang Chen, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 55 days.

(21) Appl. No.: 16/182,680

(22) Filed: Nov. 7, 2018

(65) Prior Publication Data
US 2020/0142844 A1 May 7, 2020

(51) Int. Cl.
G06F 13/16 (2006.01)
G11C 7/22 (2006.01)
G06F 3/06 (2006.01)

(52) U.S. Cl.
CPC ........ G06F 13/1689 (2013.01); G06F 3/0604 (2013.01); G06F 3/0656 (2013.01); G06F 3/0659 (2013.01); G06F 3/0673 (2013.01); G11C 7/222 (2013.01); G11C 7/225 (2013.01)

(58) Field of Classification Search
CPC ............ G06F 13/16; G06F 3/06; G11C 7/222
USPC .......................................................... 710/6
See application file for complete search history.

(56) References Cited

U.S. PATENT DOCUMENTS

| | | | |
|---|---|---|---|
| 9,570,130 B2 | 2/2017 | Yu et al. | |
| 2003/0123597 A1* | 7/2003 | Cho | G11C 7/1051 375/376 |
| 2003/0206164 A1* | 11/2003 | Juenger | G09G 5/39 345/211 |
| 2004/0004503 A1* | 1/2004 | Fischer | G11C 7/22 327/199 |
| 2006/0192282 A1* | 8/2006 | Suwa | H01L 23/50 257/723 |
| 2010/0009537 A1* | 1/2010 | Balasubramaniam | C09G 1/02 438/692 |

(Continued)

FOREIGN PATENT DOCUMENTS

TW I566256 1/2017

*Primary Examiner* — Christopher B Shin
(74) *Attorney, Agent, or Firm* — WPAT, PC (57) ABSTRACT

Disclosed is a DDR SDRAM physical layer interface circuit including: a multiphase clock generator generating a plurality of clocks including a reference clock, a first clock, a second clock and a third clock; a frequency dividing circuit generating a PHY clock according to the first clock; a clock output path outputting the reference clock to a storage circuit; a first output circuit outputting a first output signal to the storage circuit according to a first input signal of a memory controller, the first clock and the PHY clock; a second output circuit outputting a second output signal to the storage circuit according to a second input signal of the memory controller, the second clock and the PHY clock; and a third output circuit outputting a third output signal to the storage circuit according to a third input signal of the memory controller, the third clock and the PHY clock.

17 Claims, 11 Drawing Sheets

(56) References Cited

U.S. PATENT DOCUMENTS

| | | | |
|---|---|---|---|
| 2011/0296214 A1* | 12/2011 | Arntzen | G06F 1/3203 |
| | | | 713/320 |
| 2012/0072681 A1* | 3/2012 | Fujiwara | G06F 1/3225 |
| | | | 711/154 |
| 2016/0035771 A1* | 2/2016 | Huang | H01L 31/024 |
| | | | 438/67 |
| 2017/0365305 A1* | 12/2017 | Chang | G11C 5/04 |
| 2019/0129493 A1* | 5/2019 | Li | G06F 1/3246 |
| 2019/0392886 A1* | 12/2019 | Cox | G11C 11/4072 |
| 2020/0058330 A1* | 2/2020 | Chhabra | G11C 5/14 |

* cited by examiner

DDR SDRAM PHYSICAL LAYER INTERFACE CIRCUIT AND DDR SDRAM CONTROL DEVICE

BACKGROUND OF THE INVENTION

1. Field of the Invention

The present invention relates to a Double Data Rate Synchronous Dynamic Random Access Memory (DDR SDRAM) physical layer interface circuit and a DDR SDRAM control device, especially to a DDR SDRAM physical layer interface circuit and a DDR SDRAM control device characterized by smaller circuit area and/or lower power consumption.

2. Description of Related Art

As the technique development of Double Data Rate Synchronous Dynamic Random Access Memory (DDR SDRAM), Applicant's US patent (U.S. Pat. No. 9,570,130 B2) suggests using a delay-locked loop (DLL) to resolve problems about serious clock skew and long clock tree latency. However, Applicant believes that the size of circuit area and the performance of power-saving of the above-mentioned prior art can be further improved.

SUMMARY OF THE INVENTION

An object of the present invention is to provide a Double Data Rate Synchronous Dynamic Random Access Memory (DDR SDRAM) physical layer interface circuit and a DDR SDRAM control device for the improvement in circuit area and power-saving.

An embodiment of the DDR SDRAM physical layer interface circuit of the present invention is capable of adjusting the phases of signals between a memory controller and a storage controller without using a delay-locked loop which consumes a lot of circuit area. The embodiment includes a multiphase clock generator, a frequency dividing circuit, a clock output path, a first output circuit, a second output circuit, and a third output circuit. The multiphase clock generator is configured to generate a plurality of clocks including a storage circuit reference clock, a first clock, a second clock and a third clock, in which the phase of the second clock is different from the phase of the third clock. The frequency dividing circuit is configured to generate a physical layer clock (PHY clock) according to the first clock. The clock output path is coupled to the multiphase clock generator and configured to output the storage circuit reference clock to the storage circuit. The first output circuit is configured to output a first output signal to the storage circuit according to a first input signal of the memory controller, the first clock and the PHY clock. The second output circuit is configured to output a second output signal to the storage circuit according to a second input signal of the memory controller, the second clock and the PHY clock. The third output circuit is configured to output a third output signal to the storage circuit according to a third input signal of the memory controller, the third clock and the PHY clock.

Another embodiment of the DDR SDRAM physical layer interface circuit of the present invention is capable of adjusting the phases of signals between a memory controller and a storage circuit and executing a power-saving operation. The embodiment includes a multiphase clock generator, a clock output path, a frequency dividing circuit, a plurality of clock gating circuits, and a plurality of first-in-first-out (FIFO) buffers. The multiphase clock generator is configured to generate a storage circuit reference clock and a plurality of control clocks including a first clock and a second clock. The clock output path is configured to output the storage circuit reference clock to the storage circuit. The frequency dividing circuit is configured to generate a physical layer clock (PHY clock) according to the first clock. The plurality of clock gating circuits are configured to operate according to gating control of the memory controller and thereby output or stop outputting the PHY clock, output or stop outputting the first clock, and output or stop outputting the second clock. The plurality of FIFO buffers are configured to operate according to output control of the memory controller, the PHY clock and the plurality of control clocks and thereby output a first output signal, a second output signal and a third output signal to the storage circuit when the plurality of clock gating circuits output the PHY clock, the first clock and the second clock.

An embodiment of the DDR SDRAM control device of the present invention is capable of carrying out a power-saving operation. The embodiment includes a memory controller and a DDR SDRAM physical layer circuit. The memory controller is configured to control data transmission and data reception, and output a control signal and a power-saving signal. The DDR SDRAM physical layer circuit, coupled between the memory controller and a storage circuit that is used for storing or outputting data according to the control signal, is configured to output the control signal to the storage circuit and carry out a power-saving operation according to the power-saving signal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a Double Data Rate Synchronous Dynamic Random Access Memory physical layer interface circuit (DDR SDRAM PHY interface circuit) and a DDR SDRAM control device. In comparison with the invention of Applicant's US patent (U.S. Pat. No. 9,570,130 B2), the DDR SDRAM physical layer interface circuit and the DDR SDRAM control device have the advantages of smaller circuit area and/or lower power consumption. It should be noted that people of ordinary skill in the art can refer to the US patent (U.S. Pat. No. 9,570,130 B2) to understand the background knowledge of the present invention.

Figure 1:
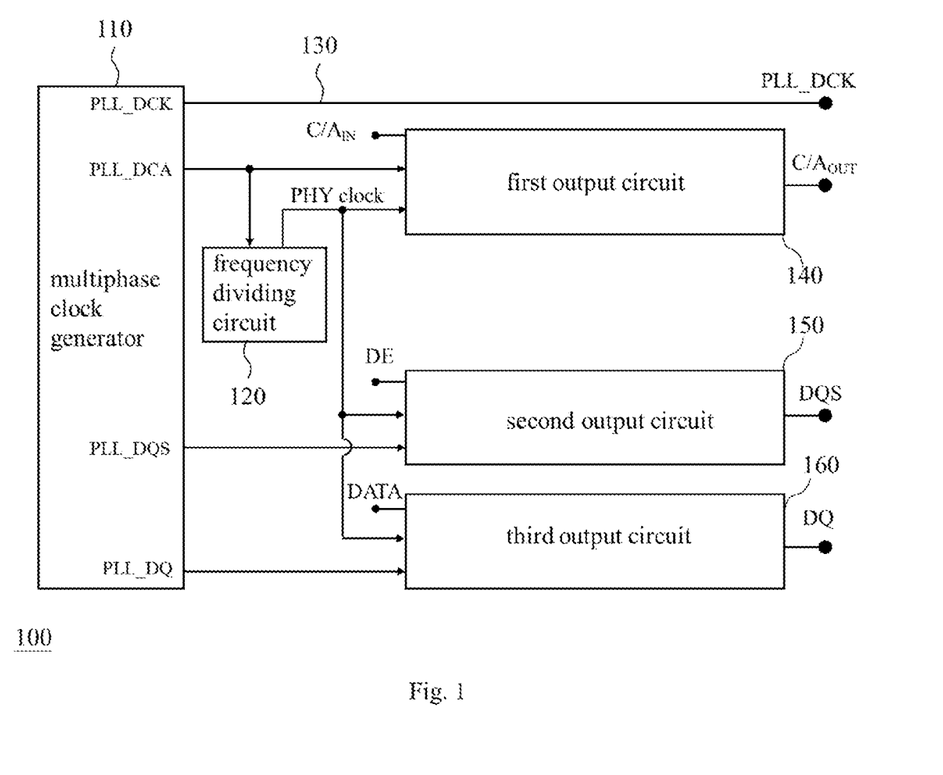
FIG. 1 shows an embodiment of the DDR SDRAM physical layer interface circuit of the present invention.

FIG. 1 shows an embodiment of the DDR SDRAM PHY interface circuit of the present invention operable to adjust the phases of signals between a memory controller and a storage circuit without using a delay-locked loop which consumes a lot of circuit area. The DDR SDRAM PHY interface circuit 100 of FIG. 1 includes a multiphase clock generator 110, a frequency dividing circuit 120, a clock output path 130, a first output circuit 140, a second output circuit 150, and a third output circuit 160.

The multiphase clock generator 110 (e.g., a phase-locked loop with a plurality of phase interpolators) is configured to generate a plurality of clocks including a storage circuit reference clock (i.e., a clock "PLL_DCK" for the operation of the storage circuit), a first clock (e.g., a clock "PLL_DCA" for the output of a command/address signal), a second clock (e.g., a clock "PLL_DQS" for the output of a data strobe signal) and a third clock (e.g., a clock "PLL_DQ" for the output of a data input/output signal), in which the phase of the second clock is different from the phase of the third clock; for instance, the phase difference between PLL_DQS and PLL_DQ is 90 degree or hundreds of picosecond in compliance with a DDR specification. The frequency dividing circuit 120 is configured to generate a physical layer clock (PHY clock) according to the first clock. The clock output path 130 is coupled to the multiphase clock generator 110 and configured to output the storage circuit reference clock to the storage circuit. The first output circuit 140 is configured to output a first output signal (e.g., an output command/address signal "C/A$_{OUT}$") to the storage circuit according to a first input signal (e.g., an input command/address signal "C/A$_{IN}$") of the memory controller, the first clock and the PHY clock. The second output circuit 150 is configured to output a second output signal (e.g., a data strobe signal "DQS") to the storage circuit according to a second input signal (e.g., a data enable signal "DE") of the memory controller, the second clock and the PHY clock. The third output circuit 160 is configured to output a third output signal (e.g., a data input/output signal "DQ") to the storage circuit according to a third input signal (e.g., a data signal "DATA") of the memory controller, the third clock and the PHY clock. For better understanding of the embodiment of FIG. 1, PLL_DCA is treated as the first clock, PLL_DQS is treated as the second clock, PLL_DQ is treated as the third clock, C/A$_{IN}$ is treated as the first input signal, DE is treated as the second input signal, DATA is treated as the third input signal, the first output signal is C/A$_{OUT}$, the second output signal is DQS, and the third output signal is DQ. It should be noted that the signals "PLL_DCK", "C/A", "DQS", "DQ", "DE" and "DATA" are known in this industrial field, and thus their detail is omitted here.

Figure 2:
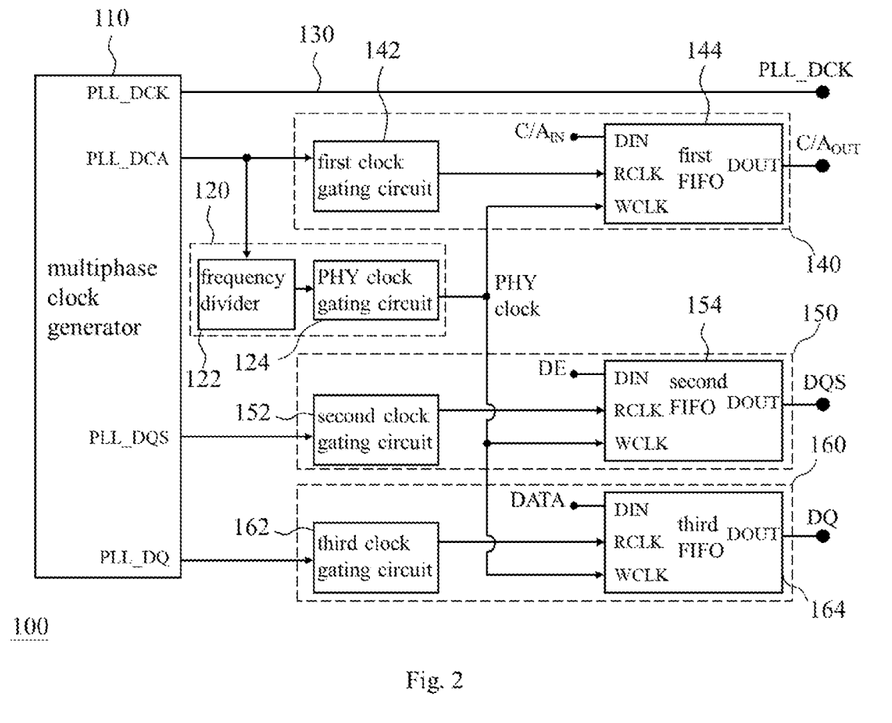
FIG. 2 shows an exemplary implementation of the embodiment of FIG. 1.

FIG. 2 shows an exemplary implementation of the embodiment of FIG. 1. The frequency dividing circuit 120 includes: a frequency divider 122 configured to generate the PHY clock according to the first clock; and a physical layer clock gating circuit (hereafter: PHY clock gating circuit) 124 configured to output or stop outputting the PHY clock to the first output circuit 140, the second output circuit 150 and the third output circuit 160 according to a physical layer clock enable signal of the memory controller. The first output circuit 140 includes: a first clock gating circuit 142 configured to output or stop outputting the first clock to a first first-in-first-out (FIFO) buffer (hereafter: first FIFO) 144 according to a first gating signal of the memory controller; and the first FIFO 144 configured to output the first output signal to the storage circuit by a terminal "DOUT" according to the first input signal from a terminal "DIN", the first clock and the PHY clock. The second output circuit 150 includes: a second clock gating circuit 152 configured to output or stop outputting the second clock to a second FIFO buffer (hereafter: second FIFO) 154 according to a second gating signal of the memory controller; and the second FIFO 154 configured to output the second output signal to the storage circuit according to the second input signal, the second clock and the PHY clock. The third output circuit 160 includes: a third clock gating circuit 162 configured to output or stop outputting the third clock to a third FIFO buffer (hereafter: third FIFO) 164 according to a third gating signal of the memory controller; and the third FIFO 164 configured to output the third output signal to the storage circuit according to the third input signal, the third clock and the PHY clock. It should be noted that the first/second/third clock is treated as a read-control clock "RCLK" for the first/second/third FIFO 144/154/164 and the PHY clock is treated as a write-control clock "WCLK" for the first/second/third FIFO 144/154/164.

In an exemplary implementation of FIG. 2, the PHY clock gating circuit 124 includes a physical clock gating component (e.g., the gating component 30 of FIG. 3a) configured to receive the physical layer clock enable signal (e.g., the clock enable signal of FIG. 3a) and the PHY clock (e.g., the PHY clock of FIG. 3a), and configured to output or stop outputting the PHY clock to the first output circuit 140, the second output circuit 150 and the third output circuit 160 according to the physical layer clock enable signal. In the same exemplary implementation of FIG. 2, the first/second/third clock gating circuit 142/152/162 includes: a first/second/third clock FIFO buffer (e.g., the FIFO buffer 310 of FIG. 3b) configured to output a first/second/third clock enable signal (e.g., the clock enable signal of FIG. 3b) according to the first/second/third gating signal (e.g., the clock gating signal of FIG. 3b), the PHY clock and the first/second/third clock (e.g., the clock signal of FIG. 3b); and a first/second/third clock gating component (e.g., gating component 320 of FIG. 3b) configured to receive the first/second/third clock enable signal and the first/second/third clock, and configured to output or stop outputting the first/second/third clock to the first/second/third FIFO buffer 144/154/164 according to the first/second/third clock enable signal.

Figure 3A:
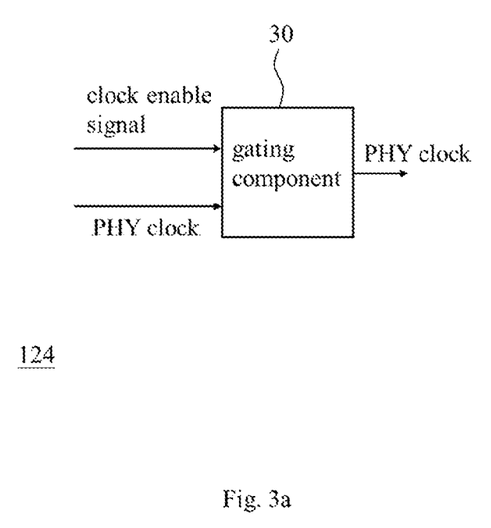
FIG. 3a shows an exemplary gating circuit for the implementation of the PHY clock gating circuit of FIG. 2.
Figure 3B:
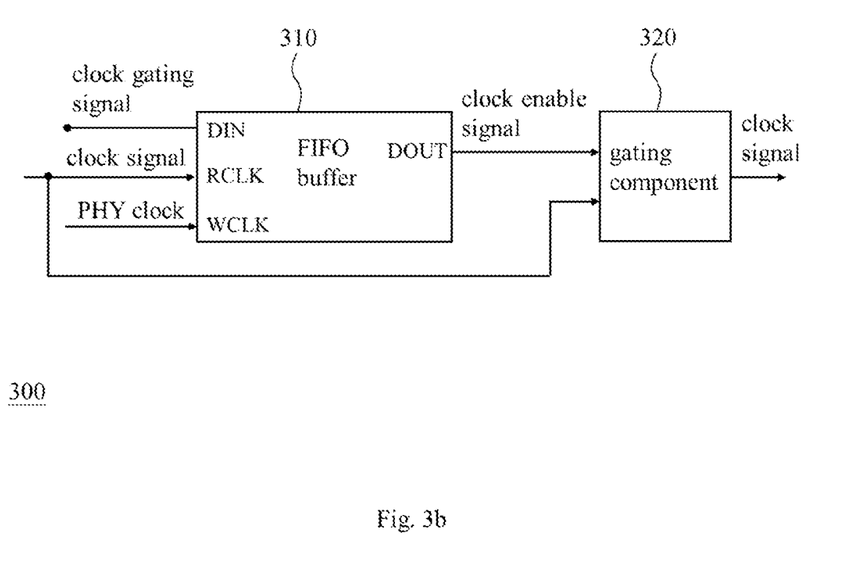
FIG. 3b shows an exemplary gating circuit for the implementation of each of the first, second and third clock gating circuits of FIG. 2.

FIG. 3a shows an exemplary gating circuit for the implementation of the PHY clock gating circuit 124 and FIG. 3b shows an exemplary gating circuit for the implementation of the first clock gating circuit 142, the second clock gating circuit 152 and the third clock gating circuit 162. The PHY clock gating circuit 124 of FIG. 3a includes a gating component 30 configured to receive the clock enable signal and the PHY clock and thereby output the PHY clock according to the clock enable signal. The gating circuit 300 of FIG. 3b includes a FIFO buffer 310 and a gating component 320. The FIFO buffer 310 includes three input terminals (i.e., DIN, RCLK, and WCLK of FIG. 3b) to receive a clock gating signal of the memory controller, a clock signal, and the PHY clock respectively, and includes an output terminal (i.e., DOUT of FIG. 3b) to output a clock enable signal; accordingly, the FIFO buffer 310 can function as each of the aforementioned first clock FIFO buffer, second clock FIFO buffer and third clock FIFO buffer. The gating component 320 is configured to receive the clock enable signal and the clock signal and thereby output the clock signal according to the clock enable signal; accordingly, the gating component 320 can function as each of the aforementioned first clock gating component, second clock gating component and third clock gating component.

Figure 4:
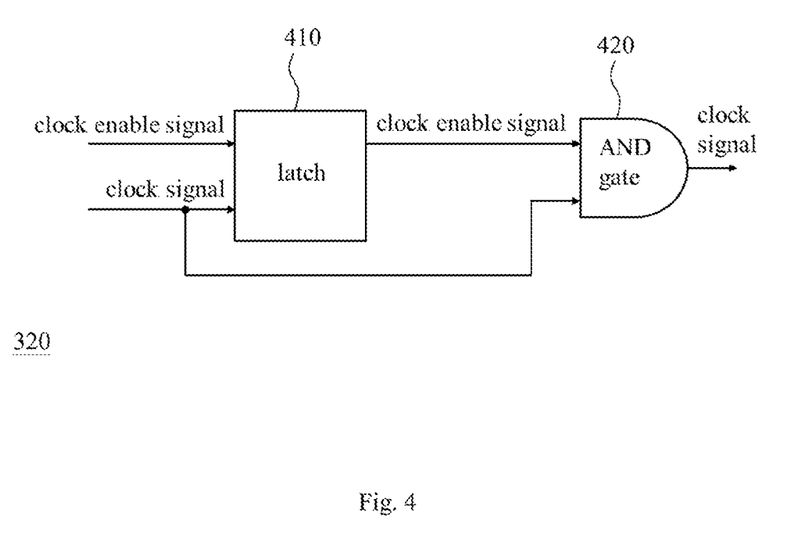
FIG. 4 shows an embodiment of each gating component of FIGS. 3a-3b.

FIG. 4 shows an embodiment of each of the gating component 30 of FIG. 3a and the gating component 320 of FIG. 3b. The gating component 320 of FIG. 4 includes a latch 410 and an AND gate 420 connected in series. Since the configurations and the operations of a latch and an AND gate are well known in this industrial field, their detail is omitted here.

Figure 5:
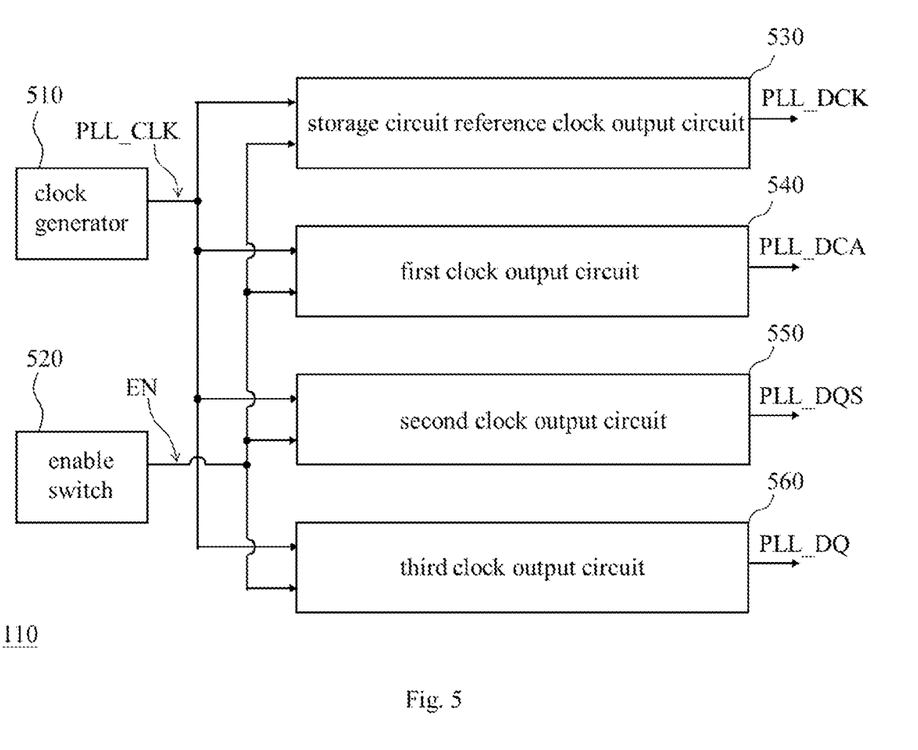
FIG. 5 shows an embodiment of the multiphase clock generator of FIG. 1.

FIG. 5 shows an embodiment of the multiphase clock generator 110 of FIG. 1. The multiphase clock generator 110 includes a clock generator 510, an enable switch 520 and a plurality of clock output circuits including a storage circuit reference clock output circuit 530, a first clock output circuit 540, a second clock output circuit 550 and a third clock output circuit 560. The clock generator 510 is configured to generate a fundamental clock (PLL_CLK). The enable switch 520 is configured to output an enable signal (EN). The storage circuit reference clock output circuit 530 is configured to output the storage circuit reference clock (PLL_DCK) according to a reference clock phase setting, the fundamental clock and the enable signal. The first/second/third clock output circuit 540/550/560 is configured to output the first/second/third clock (PLL_DCA/PLL_DQS/PLL_DQ) according to a first/second/third clock phase setting, the fundamental clock and the enable signal.

In an exemplary implementation of the embodiment of FIG. 5, the storage circuit reference clock output circuit 530 includes: a reference clock phase adjustment circuit (e.g., the phase interpolator 610 of FIG. 6) configured to generate an input reference clock (e.g., the clock "PH_CLK" of FIG. 6) according to the fundamental clock; a reference clock enable synchronizer (e.g., the synchronizer 620 of FIG. 6) configured to generate a reference clock enable signal (e.g., the signal "CLK_EN" of FIG. 6) according to the enable signal and the input reference clock; and a reference clock de-glitch circuit (e.g., the de-glitch circuit 630 of FIG. 6) configured to output the storage circuit reference clock according to the reference clock enable signal and the input reference clock. In the same exemplary implementation, the first/second/third clock output circuit 540/550/560 includes: a first/second/third clock phase adjustment circuit (e.g., the phase interpolator 610 of FIG. 6) configured to generate an input first/second/third clock (e.g., the clock "PH_CLK" of FIG. 6) according to the fundamental clock; a first/second/third clock enable synchronizer (e.g., the synchronizer 620 of FIG. 6) configured to generate a first/second/third clock enable signal (e.g., the signal "CLK_EN" of FIG. 6) according to the enable signal and the input first/second/third clock; and a first/second/third clock de-glitch circuit (e.g., the de-glitch circuit 630 of FIG. 6) configured to output the first/second/third clock according to the first/second/third clock enable signal and the input first/second/third clock.

Figure 6:
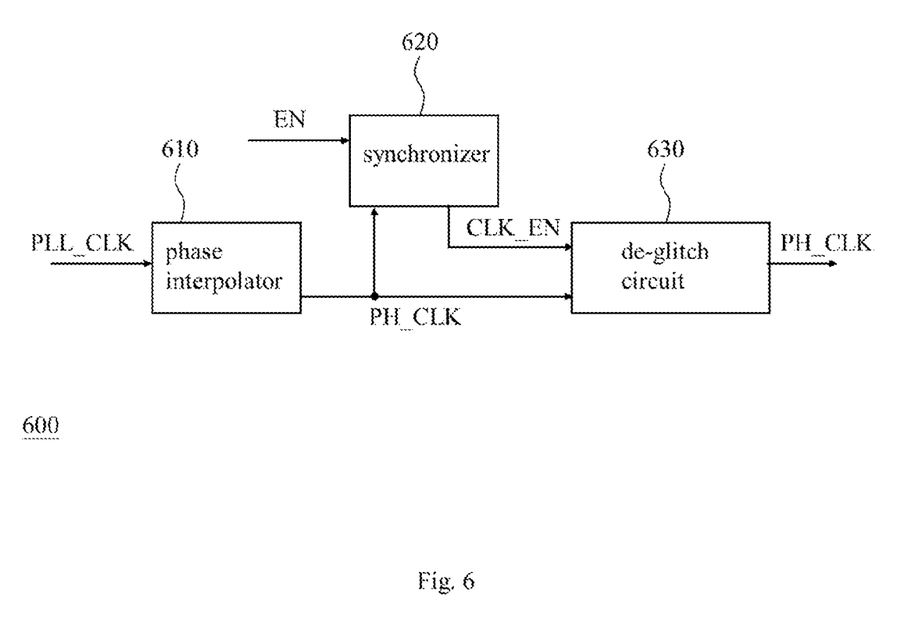
FIG. 6 shows an exemplary output circuit which can function as each output circuit of FIG. 5.

FIG. 6 shows an exemplary output circuit which can function as each of the storage circuit reference clock output circuit 530, the first clock output circuit 540, the second clock output circuit 550 and the third clock output circuit 560. The output circuit 600 includes a phase interpolator 610, a synchronizer 620 and a de-glitch circuit 630. The phase interpolator 610 is configured to generate a clock "PH_CLK" according to the fundamental clock "PLL_CLK" and a predetermined phase setting. The synchronizer 620 is configured to generate a signal "CLK_EN" according to the signal "EN" of the enable switch 520 and the clock "PH_CLK" of the phase interpolator 610. The de-glitch circuit 630 is configured to output PH_CLK according to the signal "CLK_EN" of the synchronizer 620 and the clock "PH_CLK" of the phase interpolator 610.

Figure 7:
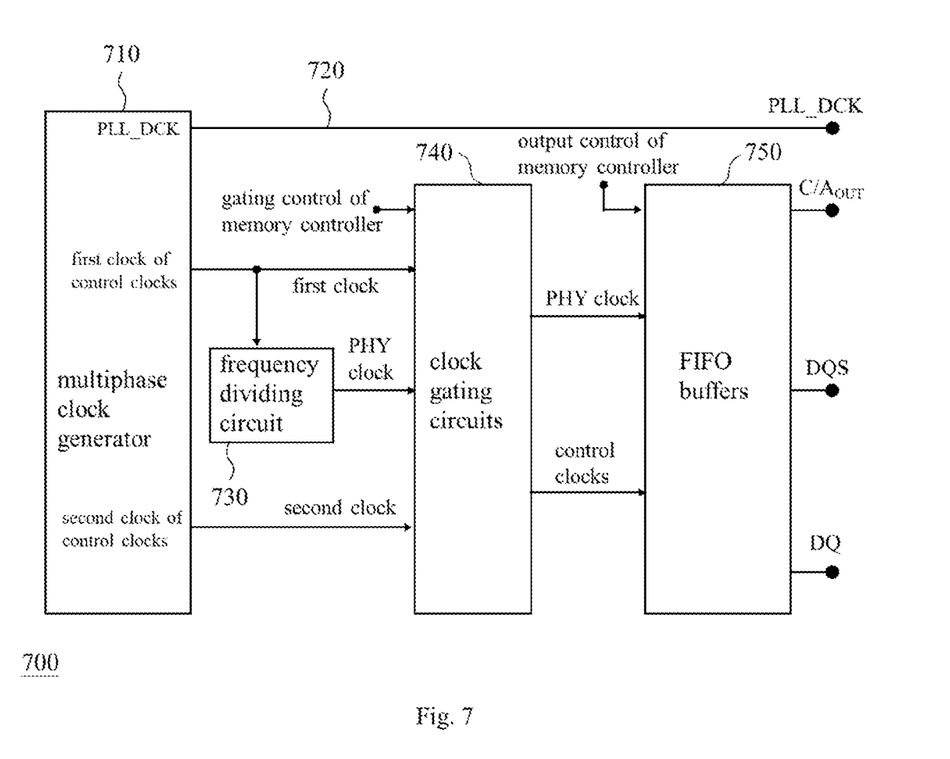
FIG. 7 shows another embodiment of the DDR SDRAM physical layer interface circuit of the present invention.

FIG. 7 shows another embodiment of the DDR SDRAM PHY interface circuit of the present invention operable to adjust the phases of signals between a memory controller and a storage circuit and execute a power-saving operation. The DDR SDRAM PHY interface circuit 700 includes a multiphase clock generator 710, a clock output path 720, a frequency dividing circuit 730, a plurality of clock gating circuits 740, and a plurality of FIFO buffers 750. The multiphase clock generator 710 is configured to generate a storage circuit reference clock (i.e., the aforementioned clock "PLL_DCK") and a plurality of control clocks including a first clock (e.g., the aforementioned clock "PLL_DCA") and a second clock (e.g., the aforementioned clock "PLL_DQS" or "PLL_DQ"). The clock output path 720 is configured to output the storage circuit reference clock to the storage circuit. The frequency dividing circuit 730 is configured to generate a physical layer clock (PHY clock) according to the first clock. The plurality of clock gating circuits 740 are configured to operate according to the gating control of the memory controller and thereby output or stop outputting the PHY clock, output or stop outputting the first clock, and output or stop outputting the second clock. The plurality of FIFO buffers 750 (e.g., the first FIFO 144, the second FIFO 154, and the third FIFO 164 of FIG. 2) are configured to operate according to the output control of the memory controller, the PHY clock and the plurality of control clocks and thereby output a first output signal (e.g., the aforementioned command/address signal "C/A$_{OUT}$"), a second output signal (e.g., the aforementioned data strobe signal "DQS") and a third output signal (e.g., the aforementioned data input/output signal "DQ") to the storage circuit when the plurality of clock gating circuits 740 output the PHY clock, the first clock and the second clock.

In an exemplary implementation of the embodiment of FIG. 7, the plurality of control clocks of the multiphase clock generator 710 further include a third clock (e.g., one of the aforementioned clocks "PLL_DQS" and "PLL_DQ" while the second clock of the control clocks is the other), and the plurality of clock gating circuits 740 (e.g., the PHY clock gating circuit 124, the first clock gating circuit 142, the second clock gating circuit 152, and the third clock gating circuit 162 of FIG. 2) are configured to output or stop outputting the PHY clock, the first clock, the second clock and the third clock in accordance with a power-saving signal (e.g., the aforementioned physical layer clock enable signal, first gating signal, second gating signal and third gating signal) of the memory controller.

Figure 8:
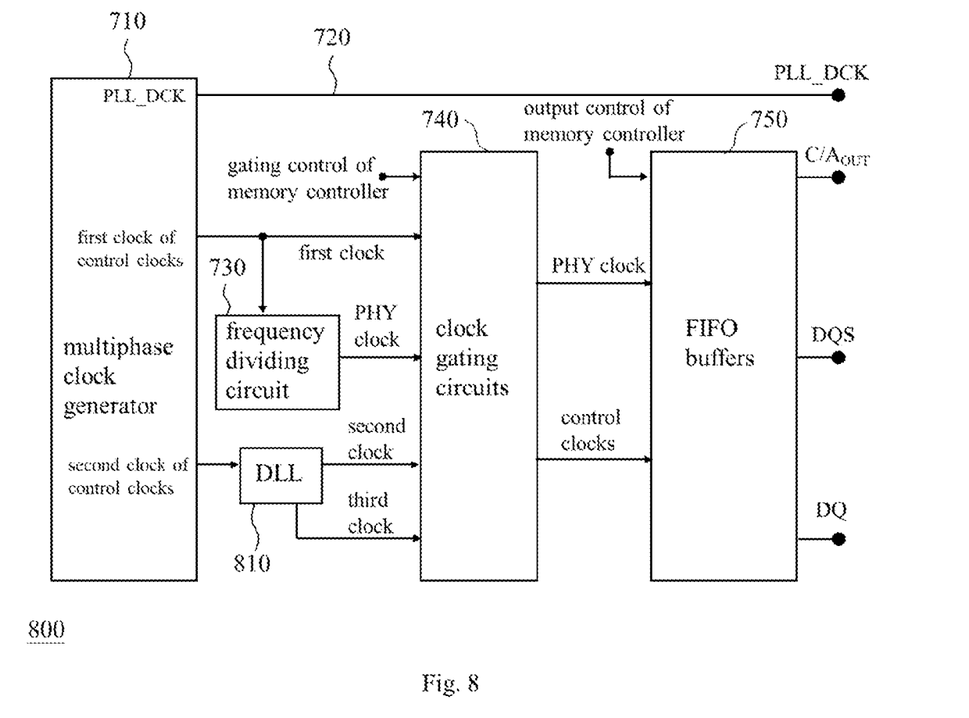
FIG. 8 shows yet another embodiment of the DDR SDRAM physical layer interface circuit of the present invention.

In another exemplary implementation of the embodiment of FIG. 7, a delay-locked loop is introduced to receive the second clock from the multiphase clock generator 710 and thereby generate a third clock according to the second clock. In detail, as shown in FIG. 8, the DDR SDRAM PHY interface circuit 800 further includes a delay-locked loop (DLL) 810 configured to output the second clock and the third clock based on the second clock and a phase difference setting so that the phase difference between the second clock and the third clock is 90 degree or hundreds of picosecond in compliance with a DDR specification; afterward the second clock and the third clock are outputted to a second clock gating circuit (e.g., the second clock gating circuit 152 of FIG. 2) and a third clock gating circuit (e.g., the third clock gating circuit 162 of FIG. 2) of the plurality of clock gating circuits 740 respectively.

Figure 9:
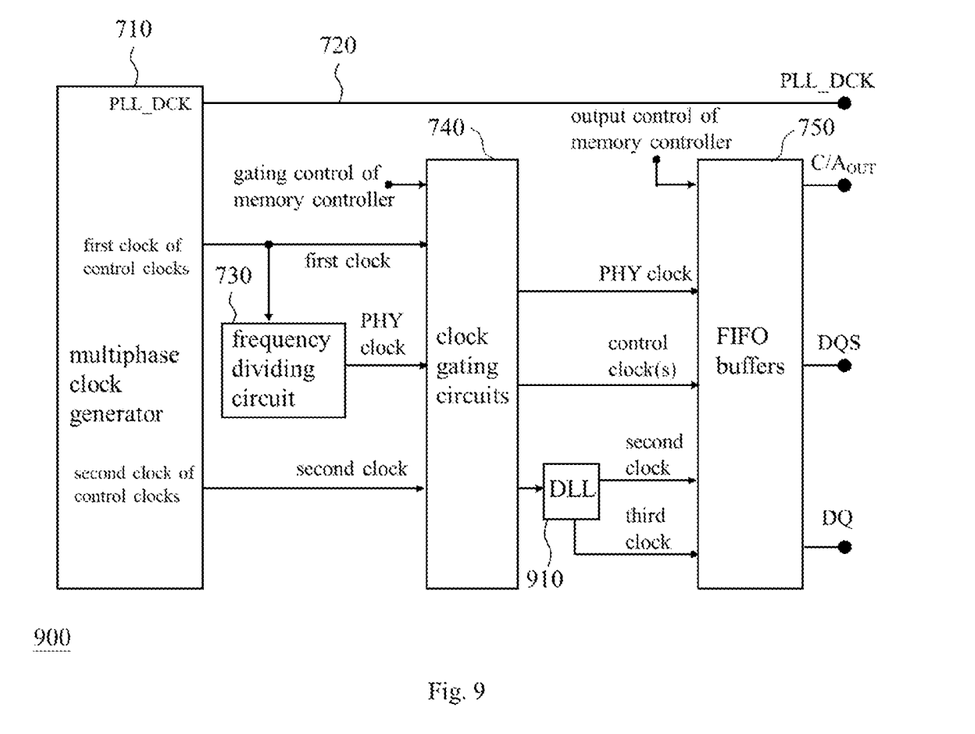
FIG. 9 shows an embodiment of the DDR SDRAM control device of the present invention.

In yet another exemplary implementation of the embodiment of FIG. 7, a delay-locked loop is introduced to receive the second clock from one of the plurality of clock gating circuits 740 (e.g., a second clock gating circuit) and thereby generate a third clock according to the second clock. In detail, as shown in FIG. 9, the DDR SDRAM PHY interface circuit 900 further includes a delay-locked loop (DLL) 910 configured to output the second clock and the third clock based on the second clock and the phase difference setting so that the phase difference between the second clock and the third clock is 90 degree or hundreds of picosecond in compliance with a DDR specification; afterward the second clock and the third clock are outputted to a second FIFO buffer (e.g., the second FIFO 154 of FIG. 2) and a third FIFO buffer (e.g., the third FIFO 164 of FIG. 2) of the plurality of FIFO buffers 750 respectively.

Figure 10:
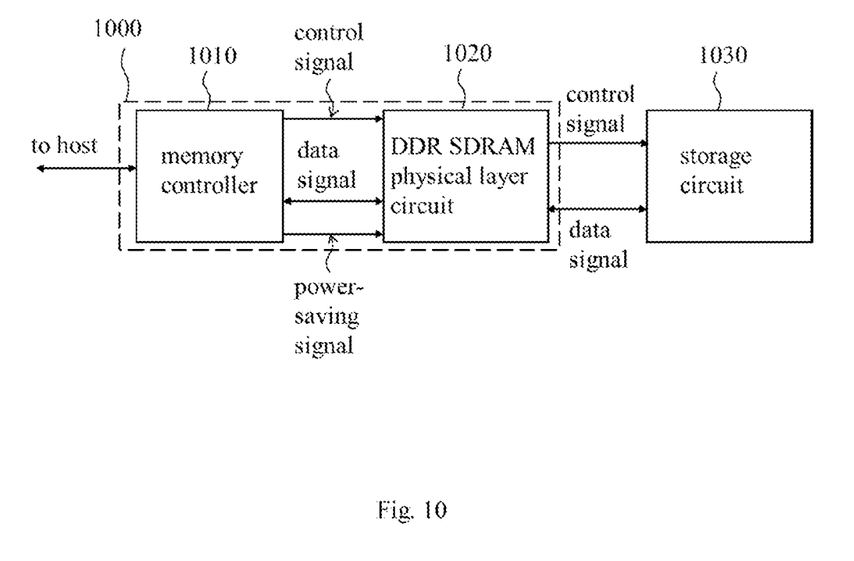
FIG. 10 shows an embodiment of the DDR SDRAM control device of the present invention operable to carry out a power-saving operation.

FIG. 10 shows an embodiment of the DDR SDRAM control device of the present invention operable to carry out a power-saving operation. The DDR SDRAM control device 1000 of FIG. 10 includes a memory controller 1010 and a DDR SDRAM physical layer circuit 1020 coupled between the memory controller and a storage circuit 1030. The memory controller 1010, which can be coupled to a host by a system bus, is configured to control data transmission and data reception, and output a control signal (e.g., a command/address signal "C/A"), a data signal and a power-saving signal (e.g., at least one of the aforementioned physical layer clock enable signal, first gating signal, second gating signal and third gating signal). The DDR SDRAM physical layer circuit 1020, coupled to the memory controller 1010, is configured to adjust the phases of signals between the memory controller 1010 and the storage circuit 1030, output the control signal to the storage circuit 1030, and carry out a power-saving operation (e.g., a clock gating operation) according to the power-saving signal. The storage circuit 1030, coupled to the DDR SDRAM physical layer circuit 1020, is configured to store or output data according to the control signal.

In an exemplary implementation of the embodiment of FIG. 10, the DDR SDRAM physical layer circuit 1020 includes all of the DDR SDRAM PHY interface circuit 700 of FIG. 7 except the plurality of clock gating circuits 740; more specifically, the DDR SDRAM physical layer circuit 1020 includes at least one clock gating circuit (e.g., at least one of the PHY clock gating circuit 124, the first clock gating circuit 142, the second clock gating circuit 152, and the third clock gating circuit 162 of FIG. 2) instead of all of the clock gating circuits 740.

Since those of ordinary skill in the art can appreciate the detail and the modification of the embodiment of FIG. 10 by referring to the disclosure of the embodiments of FIGS. 1-9, which implies that some or all of the features of the embodiments of FIGS. 1-9 can be applied to the embodiment of FIG. 10 in a reasonable way, repeated and redundant description is omitted here.

To sum up, in comparison with the prior art, the present invention is cost-effective and energy-saving.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A Double Data Rate Synchronous Dynamic Random Access Memory (DDR SDRAM) physical layer interface circuit, coupled between a memory controller and a storage circuit, comprising:

a multiphase clock generator configured to generate a plurality of clocks including a storage circuit reference clock, a first clock, a second clock and a third clock, in which a phase of the second clock is different from a phase of the third clock;

a frequency dividing circuit configured to generate a physical layer clock (PHY clock) according to the first clock;

a clock output path coupled to the multiphase clock generator and configured to output the storage circuit reference clock to the storage circuit;

a first output circuit configured to output a first output signal to the storage circuit according to a first input signal of the memory controller, the first clock and the PHY clock;

a second output circuit configured to output a second output signal to the storage circuit according to a second input signal of the memory controller, the second clock and the PHY clock; and a third output circuit configured to output a third output signal to the storage circuit according to a third input signal of the memory controller, the third clock and the PHY clock.

2. The DDR SDRAM physical layer interface circuit of claim 1, wherein the first input signal is an input command/address signal, the second input signal is a data enable signal, the third input signal is a data signal, the first output signal is an output command/address signal, the second output signal is a data strobe signal and the third output signal is a data input/output signal.

3. The DDR SDRAM physical layer interface circuit of claim 1, wherein the frequency dividing circuit includes:

a frequency divider configured to generate the PHY clock according to the first clock; and a physical layer clock gating circuit configured to output or stop outputting the PHY clock to the first output circuit, the second output circuit and the third output circuit according to a physical layer clock enable signal of the memory controller;

the first output circuit includes:

a first clock gating circuit configured to output or stop outputting the first clock to a first first-in-first-out (FIFO) buffer according to a first gating signal of the memory controller; and the first FIFO buffer configured to output the first output signal to the storage circuit according to the first input signal, the first clock and the PHY clock;

the second output circuit includes:

a second clock gating circuit configured to output or stop outputting the second clock to a second FIFO buffer according to a second gating signal of the memory controller; and the second FIFO buffer configured to output the second output signal to the storage circuit according to the second input signal, the second clock and the PHY clock; and the third output circuit includes:

a third clock gating circuit configured to output or stop outputting the third clock to a third FIFO buffer according to a third gating signal of the memory controller; and the third FIFO buffer configured to output the third output signal to the storage circuit according to the third input signal, the third clock and the PHY clock.

4. The DDR SDRAM physical layer interface circuit of claim 3, wherein the physical layer clock gating circuit includes:

a physical clock gating component configured to receive the physical layer clock enable signal and the PHY clock, and configured to output or stop outputting the PHY clock to the first output circuit, the second output circuit and the third output circuit according to the physical layer clock enable signal;

the first clock gating circuit includes:

a first clock FIFO buffer configured to output a first clock enable signal according to the first gating signal, the PHY clock and the first clock; and a first clock gating component configured to receive the first clock enable signal and the first clock, and configured to output or stop outputting the first clock to the first FIFO buffer according to the first clock enable signal;

the second clock gating circuit includes:

a second clock FIFO buffer configured to output a second clock enable signal according to the second gating signal, the PHY clock and the second clock; and a second clock gating component configured to receive the second clock enable signal and the second clock, and configured to output or stop outputting the second clock to the second FIFO buffer according to the second clock enable signal; and the third clock gating circuit includes:

a third clock FIFO buffer configured to output a third clock enable signal according to the third gating signal, the PHY clock and the third clock; and a third clock gating component configured to receive the third clock enable signal and the third clock, and configured to output or stop outputting the third clock to the third FIFO buffer according to the third clock enable signal.

5. The DDR SDRAM physical layer interface circuit of claim 4, wherein each of the physical clock gating component, the first clock gating component, the second clock gating component and the third clock gating component includes a latch and an AND gate connected in series.

6. The DDR SDRAM physical layer interface circuit of claim 1, wherein the multiphase clock generator includes:

a clock generator configured to generate a fundamental clock;

an enable switch configured to output an enable signal; and a plurality of clock output circuits including:

a storage circuit reference clock output circuit configured to output the storage circuit reference clock according to a reference clock phase setting, the fundamental clock and the enable signal;

a first clock output circuit configured to output the first clock according to a first clock phase setting, the fundamental clock and the enable signal;

a second clock output circuit configured to output the second clock according to a second clock phase setting, the fundamental clock and the enable signal; and a third clock output circuit configured to output the third clock according to a third clock phase setting, the fundamental clock and the enable signal.

7. The DDR SDRAM physical layer interface circuit of claim 6, wherein the storage circuit reference clock output circuit includes:

a reference clock phase adjustment circuit configured to generate an input reference clock according to the fundamental clock;

a reference clock enable synchronizer configured to generate a reference clock enable signal according to the enable signal and the input reference clock; and a reference clock de-glitch circuit configured to output the storage circuit reference clock according to the reference clock enable signal and the input reference clock;

the first clock output circuit includes:

a first clock phase adjustment circuit configured to generate an input first clock according to the fundamental clock;

a first clock enable synchronizer configured to generate a first clock enable signal according to the enable signal and the input first clock; and a first clock de-glitch circuit configured to output the first clock according to the first clock enable signal and the input first clock;

the second clock output circuit includes:

a second clock phase adjustment circuit configured to generate an input second clock according to the fundamental clock;

a second clock enable synchronizer configured to generate a second clock enable signal according to the enable signal and the input second clock; and a second clock de-glitch circuit configured to output the second clock according to the second clock enable signal and the input second clock; and the third clock output circuit includes:

a third clock phase adjustment circuit configured to generate an input third clock according to the fundamental clock;

a third clock enable synchronizer configured to generate a third clock enable signal according to the enable signal and the input third clock; and a third clock de-glitch circuit configured to output the third clock according to the third clock enable signal and the input third clock.

8. A Double Data Rate Synchronous Dynamic Random Access Memory (DDR SDRAM) physical layer interface circuit, coupled between a memory controller and a storage circuit, comprising:

a multiphase clock generator configured to generate a storage circuit reference clock and a plurality of control clocks including a first clock and a second clock;

a clock output path configured to output the storage circuit reference clock to the storage circuit;

a frequency dividing circuit configured to generate a physical layer clock (PHY clock) according to the first clock;

a plurality of clock gating circuits configured to operate according to a gating control of the memory controller and thereby output or stop outputting the PHY clock, output or stop outputting the first clock, and output or stop outputting the second clock; and a plurality of first-in-first-out (FIFO) buffers configured to operate according to a output control of the memory controller, the PHY clock and the plurality of control clocks and thereby output a first output signal, a second output signal and a third output signal to the storage circuit when the plurality of clock gating circuits output the PHY clock, the first clock and the second clock.

9. The DDR SDRAM physical layer interface circuit of claim 8, wherein the first output signal is an output command/address signal, the second output signal is a data strobe signal and the third output signal is a data input/output signal.

10. The DDR SDRAM physical layer interface circuit of claim 8, further comprising:

a delay-locked loop configured to receive the second clock from the multiphase clock generator and generate a data strobe clock and a data input/output clock according to the second clock, and the delay-locked loop configured to output the data strobe clock and the data input/output clock to a second clock gating circuit and a third clock gating circuit of the plurality of clock gating circuits respectively, wherein a phase of the data strobe clock is different from a phase of the data input/output clock.

11. The DDR SDRAM physical layer interface circuit of claim 8, further comprising:

a delay-locked loop configured to receive the second clock from one of the plurality of clock gating circuits and generate a data strobe clock and a data input/output clock according to the second clock, and the delay-locked loop configured to output the data strobe clock and the data input/output clock to a second FIFO buffer and a third FIFO buffer of the plurality of FIFO buffers respectively, wherein a phase of the data strobe clock is different from a phase of the data input/output clock.

12. A Double Data Rate Synchronous Dynamic Random Access Memory (DDR SDRAM) control device, comprising:

a memory controller configured to control data transmission and data reception, and output a control signal and a power-saving signal; and a DDR SDRAM physical layer circuit coupled between the memory controller and a storage circuit and configured to output the control signal to the storage circuit and carry out a power-saving operation according to the power-saving signal, wherein the storage circuit is configured to store or output data according to the control signal and the DDR SDRAM physical layer circuit includes:

a multiphase clock generator configured to generate a storage circuit reference clock and a plurality of control clocks including a first clock and a second clock;

a clock output path configured to output the storage circuit reference clock to the storage circuit;

a frequency dividing circuit configured to generate a physical layer clock (PHY clock) according to the first clock;

at least one clock gating circuit configured to operate according to the power-saving signal and thereby output or stop outputting at least one of the PHY clock, the first clock and the second clock to at least one of a plurality of first-in-first-out (FIFO) buffers; and the plurality of FIFO buffers configured to operate according to control of the memory controller, the PHY clock and the plurality of control clocks and thereby output a first output signal, a second output signal and a third output signal to the storage circuit when the PHY clock, the first clock and the second clock are outputted to the plurality of FIFO buffers.

13. The DDR SDRAM control device of claim 12, wherein the plurality of control clocks include a third clock, and the at least one clock gating circuit is configured to output or stop outputting at least one of the PHY clock, the first clock, the second clock and the third clock in accordance with the power-saving signal.

14. The DDR SDRAM control device of claim 13, wherein the plurality of FIFO buffers include:

a first FIFO buffer configured to output the first output signal according to first control of the memory controller, the PHY clock and the first clock;

a second FIFO buffer configured to output the second output signal according to second control of the memory controller, the PHY clock and the second clock; and a third FIFO buffer configured to output the third output signal according to third control of the memory controller, the PHY clock and the third clock.

15. The DDR SDRAM control device of claim 14, wherein the first output signal is an output command/address signal, the second output signal is a data strobe signal and the third output signal is a data input/output signal.

16. The DDR SDRAM control device of claim 12, wherein the at least one clock gating circuit includes a FIFO buffer circuit and a clock gating component connected in series.

17. The DDR SDRAM control device of claim 16, wherein the clock gating component includes a latch and an AND gate connected in series.

* * * * *